(12) United States Patent
Kim et al.

(10) Patent No.: US 11,031,447 B2
(45) Date of Patent: Jun. 8, 2021

(54) FLEXIBLE DISPLAY

(71) Applicant: LG Display Co., Ltd., Seoul (KR)

(72) Inventors: Eunah Kim, Asan-si (KR); Sangcheon Youn, Seoul (KR); Saemleenuri Lee, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 12 days.

(21) Appl. No.: 15/789,036

(22) Filed: Oct. 20, 2017

(65) Prior Publication Data

US 2018/0114822 A1 Apr. 26, 2018

(30) Foreign Application Priority Data

Oct. 24, 2016 (KR) .................. 10-2016-0138425

(51) Int. Cl.
| | |
|---|---|
| H01L 27/32 | (2006.01) |
| H01L 51/00 | (2006.01) |
| H01L 51/52 | (2006.01) |
| G09G 3/3225 | (2016.01) |
| G09G 3/3266 | (2016.01) |
| G09G 3/3275 | (2016.01) |

(52) U.S. Cl.
CPC ...... *H01L 27/3258* (2013.01); *H01L 27/3246* (2013.01); *H01L 27/3276* (2013.01); *H01L 51/0097* (2013.01); *G09G 3/3225* (2013.01); *G09G 3/3266* (2013.01); *G09G 3/3275* (2013.01); *G09G 2300/0426* (2013.01); *G09G 2300/0452* (2013.01); *G09G 2310/08* (2013.01); *G09G 2380/02* (2013.01); *H01L 51/5243* (2013.01); *H01L 2251/5338* (2013.01); *H01L 2251/566* (2013.01); *Y02E 10/549* (2013.01)

(58) Field of Classification Search
CPC ............ H01L 27/3246; H01L 27/3258; H01L 51/0097; H01L 51/5243; H01L 2251/5338
See application file for complete search history.

(56) References Cited

U.S. PATENT DOCUMENTS

| | | | | |
|---|---|---|---|---|
| 6,608,449 | B2* | 8/2003 | Fukunaga | ........... H01L 27/3244 |
| | | | | 313/494 |
| 6,693,385 | B2* | 2/2004 | Koyama | .............. G09G 3/2022 |
| | | | | 315/169.1 |
| 2004/0218127 | A1* | 11/2004 | Miura | ............... G02F 1/133305 |
| | | | | 349/122 |

(Continued)

FOREIGN PATENT DOCUMENTS

| | | |
|---|---|---|
| CN | 1717133 A | 1/2006 |
| CN | 104795403 A | 7/2015 |
| CN | 106158901 A | 11/2016 |

OTHER PUBLICATIONS

Chinese Office Action dated Jun. 18, 2019 in co-pending Chinese Application No. 201710966415.8.

*Primary Examiner* — Tuan A Hoang
(74) *Attorney, Agent, or Firm* — Polsinelli PC (57) ABSTRACT

A flexible display is disclosed. The flexible display includes a flexible substrate and a thin film transistor array positioned on the flexible substrate and including a thin film transistor, an organic light emitting diode, inorganic layers, and organic layers. At least one of the inorganic layers is exposed to a side of the flexible substrate. At least one of the organic layers is positioned on the at least one inorganic layer and is exposed to the side of the flexible substrate.

13 Claims, 10 Drawing Sheets

(56) References Cited

U.S. PATENT DOCUMENTS

| | | | |
|---|---|---|---|
| 2005/0062043 A1* | 3/2005 | Yang | H01L 29/66765 257/66 |
| 2006/0181204 A1 | 8/2006 | Zhu et al. | |
| 2014/0159002 A1* | 6/2014 | Lee | H01L 27/3246 257/40 |
| 2014/0217397 A1* | 8/2014 | Kwak | H01L 27/1218 257/43 |
| 2015/0041791 A1* | 2/2015 | Lee | H01L 27/3276 257/40 |
| 2016/0190389 A1* | 6/2016 | Lee | H01L 27/124 257/93 |
| 2017/0117502 A1* | 4/2017 | Park | H01L 51/56 |

* cited by examiner

FIG. 1

RELATED ART

FLEXIBLE DISPLAY

CROSS REFERENCE TO RELATED APPLICATION

This application claims the priority benefit of Korean Patent Application No. 10-2016-0138425 filed on Oct. 24, 2016, which is incorporated herein by reference in its entirety for all purposes as if fully set forth herein.

BACKGROUND

Field of the Disclosure

The present disclosure relates to a display device, and more particularly, to a flexible display. Although the present disclosure is suitable for a wide scope of applications, it is particularly suitable for providing the flexible display with reliability and stability.

Description of the Background

With development of information technology, the market of display devices used as a connection medium between a user and information is growing. Thus, the use of display devices, such as an electroluminescent display, a liquid crystal display (LCD), and a plasma display panel (PDP), is on the rise.

An electroluminescent display is a self-emission display device. Thus, the electroluminescent display can be manufactured to have a lower power consumption and a thinner profile than a liquid crystal display which requires a backlight unit. In addition, the electroluminescent displays have advantages of a wide viewing angle and a fast response time. As a process technology of the electroluminescent displays has been developed to mass-produce large-screen electroluminescent displays, the electroluminescent displays have expanded its market while competing with the liquid crystal displays.

Each pixel of an electroluminescent display includes an organic light emitting diode (OLED) having a self-emitting structure. The electroluminescent display may be variously classified depending on kinds of emission materials, an emission method, an emission structure, a driving method, and the like. For example, the electroluminescent display may be classified into a fluorescent display and a phosphorescent display depending on the emission method. Further, the electroluminescent display may be classified into a top emission display and a bottom emission display depending on the emission structure. In addition, the electroluminescent display may be classified into a passive matrix OLED (PMOLED) display and an active matrix OLED (AMOLED) display depending on the driving method.

Flexible displays have been recently commercialized. The flexible display may reproduce an input image on the screen of a display panel, on which plastic OLEDs are formed. The plastic OLEDs are formed on a flexible plastic substrate. The flexible displays may be implemented in various designs and have advantages in terms of portability and durability. The flexible displays can be implemented in various forms including a bendable display, a foldable display, a rollable display, and the like. The flexible displays may be applied not only to a mobile device, such as a smart phone and a tablet PC, but also to a television, an automobile display, and a wearable device. An application field of the flexible displays is expanding.

Figure 1:
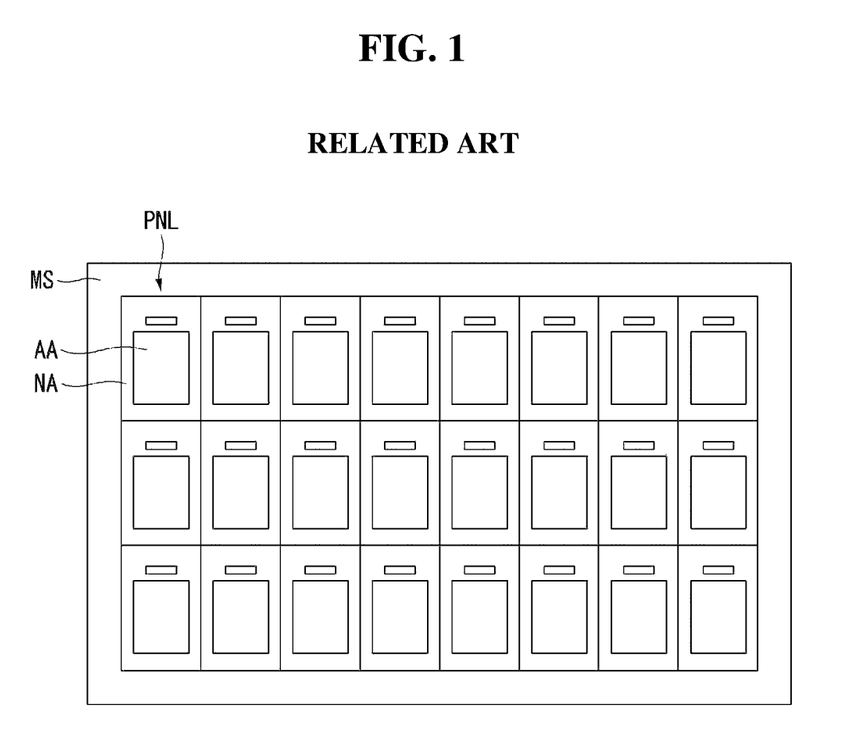
FIG. 1 illustrates a mother substrate for manufacturing a plurality of display panels.

FIG. 1 illustrates a mother substrate for manufacturing a plurality of display panels.

Referring to FIG. 1, a mother substrate MS is a substrate used to simultaneously manufacture a plurality of display panels PNL for convenience of process. Components constituting the plurality of display panels PNL are simultaneously formed on the mother substrate MS, and the display panels PNL are individually separated from the mother substrate through a cutting process. The cutting process includes a scribing process or a laser process. The display panels PNL are separated on a per cell basis and are each implemented as a flexible display.

SUMMARY

The present disclosure is to provide a flexible display capable of ensuring reliability and stability of a product by preventing a crack from being generated in an inorganic layer positioned at an end of a flexible substrate in a cutting process.

In one aspect, there is provided a flexible display including a flexible substrate, and a thin film transistor array positioned on the flexible substrate, the thin film transistor array including a thin film transistor, an organic light emitting diode, inorganic layers, and organic layers, wherein at least one of the inorganic layers is exposed to a side of the flexible substrate, and wherein at least one of the organic layers is positioned on the at least one inorganic layer and is exposed to the side of the flexible substrate.

The thin film transistor array includes a gate electrode, a gate insulating layer covering the gate electrode, a semiconductor layer positioned on the gate insulating layer and partially overlapping the gate electrode, a source electrode and a drain electrode positioned on the semiconductor layer and respectively contacting both sides of the semiconductor layer, a passivation layer covering the source electrode and the drain electrode, an overcoat layer covering the passivation layer, a first electrode positioned on the overcoat layer and contacting the drain electrode through a contact hole penetrating the passivation layer and the overcoat layer, a bank layer exposing a portion of the first electrode, an organic emission layer positioned on the first electrode exposed by the bank layer, and a second electrode positioned on the organic emission layer.

The inorganic layer exposed to the side of the flexible substrate is at least one of the gate insulating layer and the passivation layer.

The organic layer exposed to the side of the flexible substrate is the overcoat layer. Alternatively, the organic layer exposed to the side of the flexible substrate is the bank layer. Alternatively, the organic layer exposed to the side of the flexible substrate is a stack of the overcoat layer and the bank layer.

The flexible display further includes an encapsulation layer positioned on the thin film transistor array, the encapsulation layer including a metal material. The encapsulation layer is positioned at a predetermined distance inward from an end of the flexible substrate.

The flexible display further includes a gate driver circuit positioned on the flexible substrate in a gate-driver-in panel (GIP) type. The organic layer exposed to the side of the flexible substrate covers the gate driver circuit.

In another aspect, there is provided a flexible display including a flexible substrate including an organic light emitting diode and a thin film transistor connected to the organic light emitting diode, including at least one inorganic layer positioned on the flexible substrate and extended up to an end of the flexible substrate, and at least one organic layer positioned on the at least one inorganic layer and extended up to the end of the flexible substrate.

The at least one organic layer is positioned as an uppermost layer at the end of the flexible substrate.

In a further aspect, there is provided a flexible display having a display area and a non-display area on a flexible substrate includes a thin film transistor, an organic light emitting diode, inorganic layers, and organic layers at the display area, wherein the inorganic layers are extended from the display area to the non-display area, and at least one of the organic layers is extended from the display area to the non-display area.

It is to be understood that both the foregoing general description and the following description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate aspects of the disclosure and together with the description serve to explain the principles of the disclosure.

In the drawings.

DETAILED DESCRIPTION

Reference will now be made in detail to aspects of the present disclosure, examples of which are illustrated in the accompanying drawings. Wherever possible, the same reference numbers will be used throughout the drawings to refer to the same or like parts. It will be paid attention that detailed description of known arts will be omitted if it is determined that the arts can mislead aspects of the present disclosure.

Figure 2:
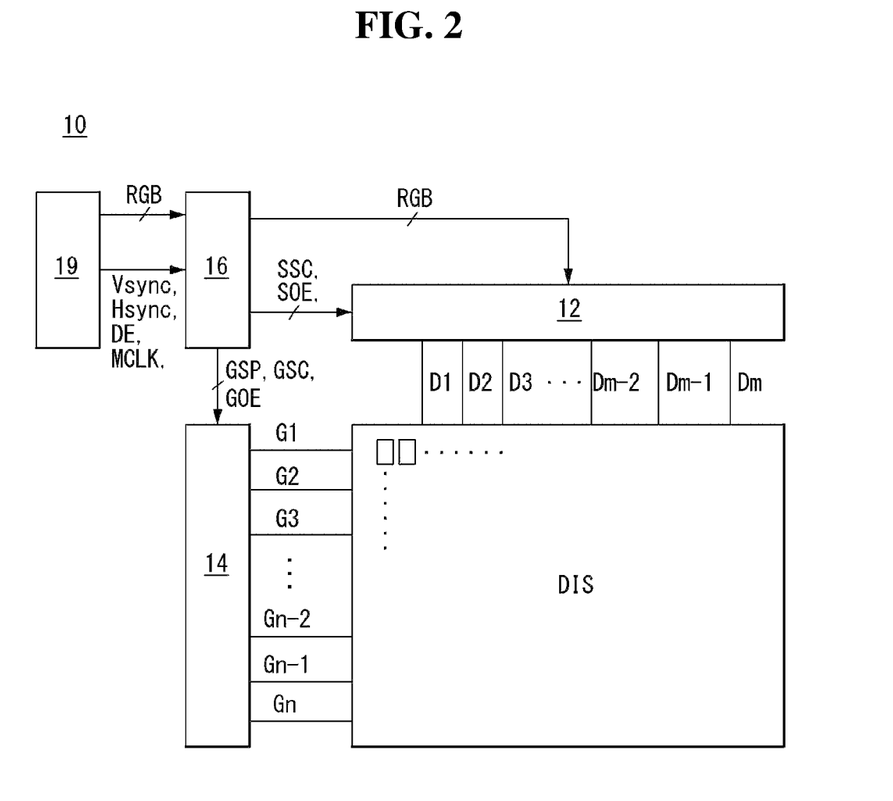
FIG. 2 is a block diagram schematically illustrating a flexible display according to an aspect.
Figure 3:
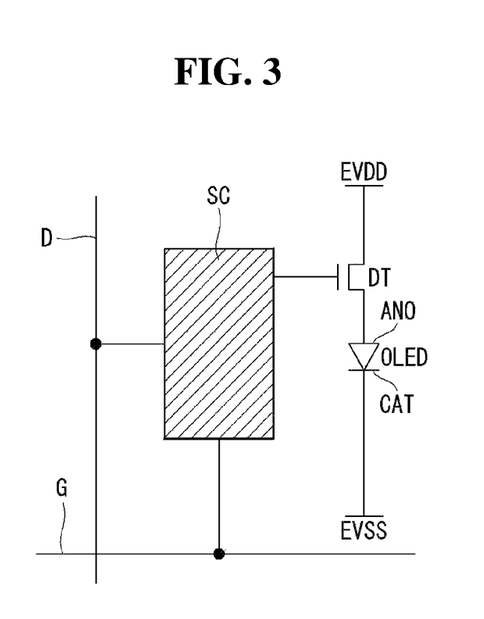
FIG. 3 schematically illustrates configuration of a pixel of a display panel.
Figure 4:
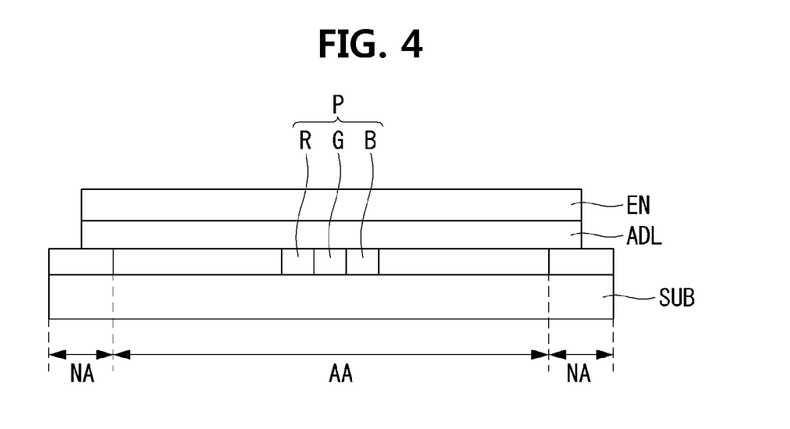
FIG. 4 is a cross-sectional view schematically illustrating a structure of a display panel.

FIG. 2 is a block diagram schematically illustrating a flexible display according to an aspect of the disclosure. FIG. 3 schematically illustrates configuration of a pixel of a display panel. FIG. 4 is a cross-sectional view schematically illustrating a structure of a display panel.

Referring to FIG. 2, a flexible display 10 according to an aspect of the disclosure includes a display driving circuit and a display panel DIS.

The display driving circuit includes a data driver circuit 12, a gate driver circuit 14, and a timing controller 16. The display driving circuit applies a video data voltage of an input image to pixels of the display panel DIS. The data driver circuit 12 converts digital video data RGB of an input image received from the timing controller 16 into an analog gamma compensation voltage and generates a data voltage. The data driver circuit 12 then supplies the data voltage to data lines D1 to Dm. The gate driver circuit 14 sequentially supplies a gate signal synchronized with the data voltage to gate lines G1 to Gn and selects pixels of the display panel DIS to which the data voltage is applied.

The timing controller 16 receives timing signals, such as a vertical sync signal Vsync, a horizontal sync signal Hsync, a data enable signal DE, and a main clock MCLK, from a host system 19 and synchronizes operation timings of the data driver circuit 12 and the gate driver circuit 14. A data timing control signal for controlling operation timing of the data driver circuit 12 may include a source sampling clock SSC, a source output enable signal SOE, and the like, but is not limited thereto. A gate timing control signal for controlling operation timing of the gate driver circuit 14 may include a gate start pulse GSP, a gate shift clock GSC, a gate output enable signal GOE, and the like, but is not limited thereto.

The host system 19 may be one of a television system, a set-top box, a navigation system, a DVD player, a Blu-ray player, a personal computer (PC), a home theater system, a phone system, and other systems that include or operate in conjunction with a display. The host system 19 may include a system-on-chip (SoC), in which a scaler is embedded, and convert digital video data RGB of an input image into a format suitable for displaying the input image on the display panel DIS. The host system 19 transmits the digital video data RGB of the input image and the timing signals Vsync, Hsync, DE, and MCLK to the timing controller 16.

The display panel DIS may include a pixel array. The pixel array includes pixels defined by the data lines D1 to Dm and the gate lines G1 to Gn, where "m" and "n" are a positive integer. Each pixel includes an organic light emitting diode (OLED) having a self-emitting structure.

As shown in FIG. 3, on the display panel DIS, a plurality of data lines D and a plurality of gate lines G intersect each other, and pixels are arranged in a matrix form at intersections of the data lines D and the gate lines G. Each pixel may include an OLED, a driving thin film transistor (TFT) DT controlling an amount of current flowing in the OLED, and a programming unit SC for setting a gate-to-source voltage of the driving TFT DT.

The programming unit SC may include at least one switching TFT and at least one storage capacitor. The switching TFT is turned on in response to a gate signal from the gate line G and applies a data voltage from the data line D to an electrode on one side of the storage capacitor. The driving TFT DT controls an amount of current supplied to the OLED depending on a magnitude of a voltage stored in the storage capacitor and adjusts an amount of light emitted by the OLED. The amount of light emitted by the OLED is proportional to an amount of current supplied by the driving TFT DT. The pixel is connected to a high potential voltage source EVDD and a low potential voltage source EVSS and receives a high potential power voltage and a low potential power voltage from a power generator (not shown). The TFTs constituting the pixel may be p-type transistors or n-type transistors. A semiconductor layer of each of the TFTs constituting the pixel may include amorphous silicon, polycrystalline silicon, or oxide. The OLED may include an anode electrode ANO, a cathode electrode CAT, and an organic compound layer between the anode electrode ANO and the cathode electrode CAT. The anode electrode ANO is connected to the driving TFT DT.

As shown in FIG. 4, the flexible display according to the aspect of the disclosure may include a flexible substrate SUB having a TFT array. The flexible substrate SUB may be formed of at least one of polyimide (PI), polyethylene terephthalate (PET), polyethylene naphthalate (PEN), polycarbonate (PC), polyethersulfone (PES), polyarylate (PAR), polysulfone (PSF), or cyclic olefin copolymer (COC). However, aspects of the disclosure are not limited thereto. Thus, the flexible display 10 according to the aspects of the disclosure has a flexible characteristic.

The TFT array may include a display area AA having a plurality of pixels P. The plurality of pixels P may include red (R), green (G), and blue (B) subpixels, but are not limited thereto. For example, the pixels P may further include white (W) subpixels.

The flexible display according to the aspect of the disclosure may further include an encapsulation layer EN. The encapsulation layer EN is positioned on the TFT array. The encapsulation layer EN may cover the pixels P in order to block moisture or oxygen that may penetrate into the pixels P. The encapsulation layer EN includes a metal material. The encapsulation layer EN may be referred to as face seal metal (FSM). For example, the encapsulation layer EN may be made of invar which is an alloy of iron (Fe) and nickel (Ni) each having a low thermal expansion coefficient. The encapsulation layer EN may be attached to the flexible substrate SUB through an adhesive layer ADL. The adhesive layer ADL may surround the pixels P.

Because the encapsulation layer EN includes the metal material, a cutting process may not be smoothly performed when the encapsulation layer EN is positioned on a cutting line. Thus, the encapsulation layer EN may be positioned at a predetermined distance inward from the end of the flexible substrate SUB, so that the cutting process can be easily performed.

Figure 5:
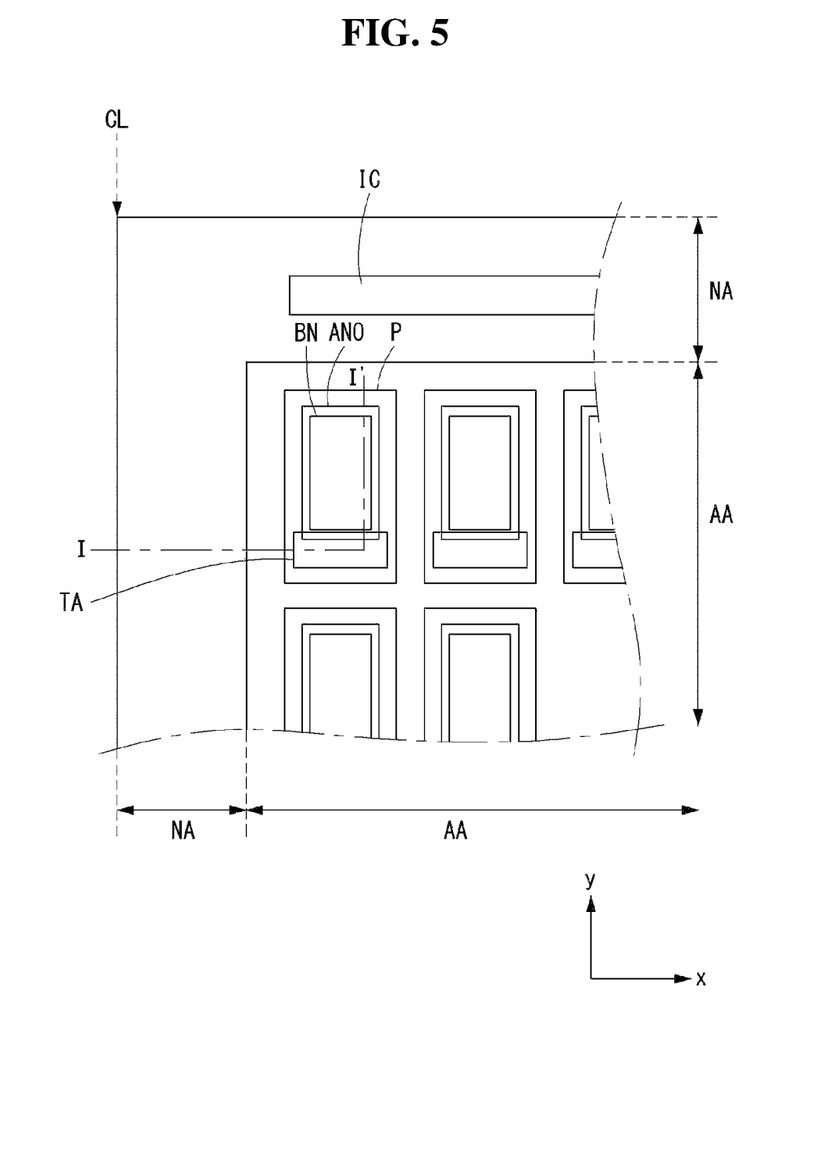
FIGS. 5 and 6 illustrate a flexible display according to an aspect of the disclosure.
Figure 6:
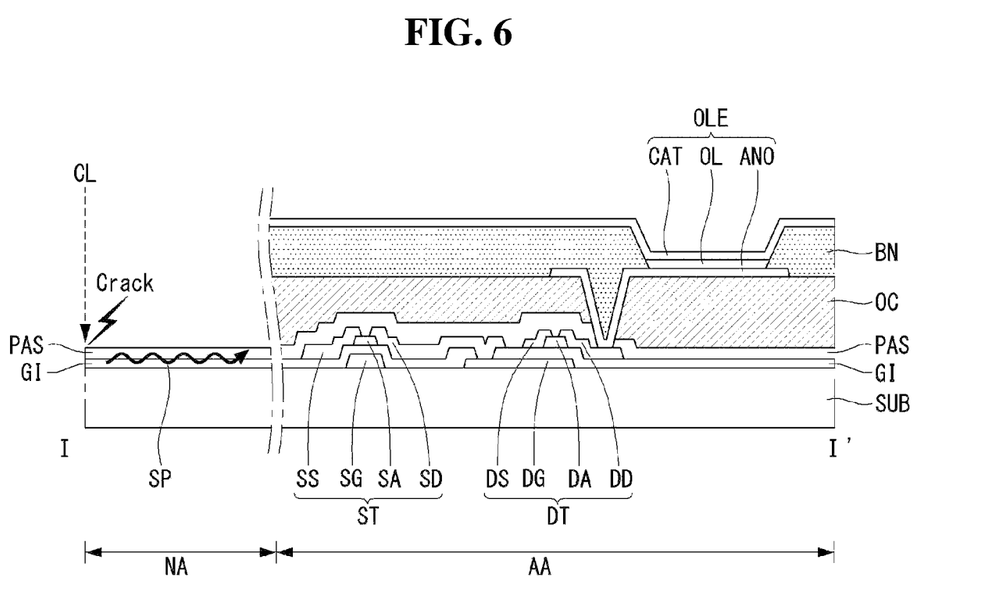

FIGS. 5 and 6 illustrate a flexible display according to an aspect of the disclosure.

Referring to FIG. 5, the flexible display according to the aspect of the disclosure may include a flexible substrate SUB divided into a display area AA displaying image information and a non-display area NA surrounding the display area AA.

A plurality of pixels P is arranged in a matrix form in the display area AA. Each pixel P may include an organic light emitting diode OLE and TFTs ST and DT for driving the organic light emitting diode OLE. The TFTs ST and DT may be formed in a TFT area TA defined as one side of the pixel P. The organic light emitting diode OLE may include an anode electrode ANO, a cathode electrode CAT, and an organic emission layer OL between the anode electrode ANO and the cathode electrode CAT.

A driver IC for driving the display area AA may be disposed in the non-display area NA. The driver IC may include a data driver circuit for supplying signals corresponding to image information to data lines (not shown) and a gate driver circuit for supplying scan signals to gate lines (not shown). The gate driver circuit may be directly disposed in the non-display area NA of the flexible substrate SUB in accordance with a scheme of a gate-driver-in panel (GIP) circuit.

Referring to FIG. 6, a switching TFT ST and a driving TFT DT are disposed at the TFT area. The switching TFT ST may be formed at an intersection of the gate line and the data line and serve to select the pixel. The driving TFT DT may serve to drive the organic light emitting diode OLE of the pixel selected by the switching TFT ST.

The TFTs ST and DT are not limited to the structure described below. Namely, the TFTs ST and DT may be implemented as TFTs including a silicon semiconductor, or implemented as TFTs including an oxide semiconductor. The silicon semiconductor may include amorphous silicon or crystallized polycrystalline silicon. The polycrystalline silicon has a high mobility (for example, more than 100 cm$^2$/Vs), a low power consumption, and an excellent reliability. Thus, the polycrystalline silicon can be applied to a gate driver and/or a multiplexer (MUX) for use in a driving element or applied to a driving TFT of each pixel. Examples of the oxide semiconductor may include zinc oxide semiconductor such as indium gallium zinc oxide (IGZO). Because the oxide semiconductor has a low OFF-current, the oxide semiconductor may be suitable for a switching TFT which has a short ON-time and a long OFF-time. Further, because the oxide semiconductor increases a voltage hold time of the pixel due to the low OFF-current, the oxide semiconductor is suitable for a display device requiring a low-speed drive and/or low power consumption. The TFTs ST and DT according to the aspect of the disclosure may be implemented as various structures including a bottom gate structure, a top gate structure, a double gate structure, and the like.

The TFTs ST and DT include semiconductor layers SA and DA, gate electrodes SG and DG, source electrodes SS and DS, and drain electrodes SD and DD that are formed on the flexible substrate SUB, respectively.

The gate electrodes SG and DG are positioned on the flexible substrate SUB. The gate electrodes SG and DG may be formed of one of copper (Cu), molybdenum (Mo), aluminum (Al), chrome (Cr), gold (Au), titanium (Ti), nickel (Ni), neodymium (Nd), tantalum (Ta), and tungsten (W), or a combination thereof. The gate electrodes SG and DG may have a single-layered structure or a multi-layered structure.

A gate insulating layer GI is positioned on the gate electrodes SG and DG. The gate insulating layer GI insulates the gate electrodes SG and DG and may include an inorganic material. For example, the gate insulating layer GI may be formed of a silicon oxide (SiOx) layer, a silicon nitride (SiNx) layer, or a multilayer thereof. Generally, the gate insulating layer GI is formed on the entire surface of a mother substrate MS (see FIG. 1) for convenience of process.

The semiconductor layers SA and DA are positioned on the gate insulating layer GI. Portions of the semiconductor layers SA and DA overlapping the gate electrodes SG and DG are defined as a channel.

The source electrodes SS and DS and the drain electrodes SD and DD are positioned opposite to each other at a predetermined distance on the semiconductor layers SA and DA. The source electrodes SS and DS respectively contact one side of the semiconductor layers SA and DA, and the drain electrodes SD and DD respectively contact the other side of the semiconductor layers SA and DA. The source electrodes SS and DS and the drain electrodes SD and DD may be formed as a single layer or a multilayer. When the source electrodes SS and DS and the drain electrodes SD and DD are formed as the single layer, the source electrodes SS and DS and the drain electrodes SD and DD may be formed of one of molybdenum (Mo), aluminum (Al), chrome (Cr), gold (Au), titanium (Ti), nickel (Ni), neodymium (Nd), and copper (Cu), or a combination thereof. When the source electrodes SS and DS and the drain electrodes SD and DD are formed as the multilayer, the source electrodes SS and DS and the drain electrodes SD and DD may be formed as a double layer of Mo/Al—Nd, Mo/Al or Ti/Al or a triple layer of Mo/Al—Nd/Mo, Mo/Al/Mo or Ti/Al/Ti.

A passivation layer PAS is positioned on the TFTs ST and DT. The passivation layer PAS protects the TFTs ST and DT and includes an inorganic material. For example, the passivation layer PAS may be formed of a silicon oxide ($SiO_x$) layer, a silicon nitride ($SiN_x$) layer, or a multilayer thereof. The passivation layer PAS is formed on the entire surface of the mother substrate MS (shown in FIG. 1) for convenience of process.

An overcoat layer OC is positioned on the passivation layer PAS. The overcoat layer OC may be a planarization layer for reducing a height difference (or step coverage) of an underlying structure and may be formed of an organic material such as photo acryl, polyimide, benzocyclobutene-based resin, and acrylate-based resin.

The organic light emitting diode OLE is positioned on the overcoat layer OC. The organic light emitting diode OLE includes the anode electrode ANO, the organic emission layer OL, and the cathode electrode CAT. More specifically, the anode electrode ANO is positioned on the overcoat layer OC. The anode electrode ANO is connected to a portion (for example, a portion of the drain electrode DD) of the TFT DT through a contact hole penetrating the passivation layer PAS and the overcoat layer OC. The anode electrode ANO may serve as a transmissive electrode formed of a transparent conductive material such as indium tin oxide (ITO), indium zinc oxide (IZO), and zinc oxide (ZnO). Alternatively, the anode electrode ANO may serve as a reflective electrode further including a reflective layer. The reflective layer may be formed of aluminum (Al), copper (Cu), silver (Ag), nickel (Ni), and palladium (Pd) or a combination thereof. For example, the reflective layer may be formed of an Ag/Pd/Cu (APC) alloy. Namely, a material constituting the anode electrode ANO can be selected depending on an emission type.

A bank layer BN defining the pixels is positioned on the flexible substrate SUB including the anode electrode ANO. The bank layer BN may be formed of an organic material such as polyimide, benzocyclobutene-based resin, and acrylate.

The organic emission layer OL is positioned on the anode electrode ANO exposed by the bank layer BN. The organic emission layer OL is a layer, in which electrons and holes are combined to emit light. At least one of a hole injection layer and a hole transport layer may be positioned between the organic emission layer OL and the anode electrode ANO, and at least one of an electron injection layer and an electron transport layer may be positioned on the organic emission layer OL.

The cathode electrode CAT is positioned on the organic emission layer OL. The cathode electrode CAT may be formed of magnesium (Mg), calcium (Ca), aluminum (Al), and silver (Ag), or a combination thereof each having a low work function. The cathode electrode CAT may serve as a transmissive electrode that is thin enough to transmit light. Alternatively, the cathode electrode CAT may serve as a reflective electrode that is thick enough to reflect light. Namely, a material constituting the cathode electrode CAT may be selected depending on an emission type.

When a plurality of display panels is simultaneously manufactured using one mother substrate MS, a cutting process for individually separating the plurality of display panels is performed. The cutting process may include a scribing process, a laser process, and the like. A cutting line CL is formed between the adjacent display panels, and the display panels are cut along the cutting line CL to implement respective flexible displays.

A fine crack may be generated in an inorganic layer such as the gate insulating layer GI and the passivation layer PAS positioned on the cutting line CL due to an external force provided when the cutting process is performed. For example, in the scribing process, the gate insulating layer GI and/or the passivation layer PAS which are exposed to the outside may directly contact a scribing means (compressing means or blanking means) and may be pressed by the scribing means, and the crack may be generated in the gate insulating layer GI and/or the passivation layer PAS due to an impact of the scribing means.

The fine crack may be generated due to an external impact or a panel modification and propagated to the inside via the gate insulating layer GI and the passivation layer PAS. In FIG. 6, "SP" indicates that the fine crack is propagated to the inside. In aspects disclosed herein, the panel modification indicates that a shape of the display panel is modified by an operation of rolling or folding. The crack propagated to the inside may generate damage such as a crack in the component (for example, the TFTs ST and DT) of the flexible display and may serve as an inflow path of moisture and oxygen to deteriorate the component such as the TFTs ST and DT. As a result, a stain of black spots and black lines may occur on the display panel and lead to a reduction in the image quality.

In order to prevent a reduction in the image quality, a method for patterning the inorganic layer such as the gate insulating layer GI and the passivation layer PAS so that the inorganic layer does not overlap the cutting line CL and is positioned inside the cutting line CL may be considered. In this instance, the flexible display according to the aspect of the disclosure can prevent the fine crack from being generated in the inorganic layer, but requires a separate process for the patterning. Therefore, manufacturing time and manufacturing cost can be increased, and a defective occurrence rate can be increased. As a result, the manufacturing yield can be reduced.

The flexible display according to the aspect of the disclosure is configured such that an organic layer including an organic material is extended to cover the inorganic layer positioned on the cutting line CL. Namely, the flexible display according to the aspect of the disclosure is configured such that an organic layer including an organic material is formed on the entire surface of the mother substrate MS (shown in FIG. 1) correspondingly to the inorganic layer such as the gate insulating layer GI and the passivation layer PAS.

As will be described later, the inorganic layer positioned on the cutting line CL is an inorganic layer which insulates the signal lines and the electrodes disposed on the thin film transistor array and is extended up to the end of the flexible substrate. The inorganic layer may include one of materials constituting the gate insulating layer and the passivation layer. However, aspects of the disclosure are not limited thereto. The inorganic layer positioned on the cutting line CL may use any insulating layer that is disposed on the thin film transistor array and insulates and protects the signal lines and the electrodes.

The organic layer positioned on the cutting line CL is an organic layer which insulates the signal lines and the electrodes disposed on the thin film transistor array and is extended up to the end of the flexible substrate. The organic layer may include one of materials constituting the overcoat layer and the bank layer. However, aspects of the disclosure are not limited thereto. The organic layer positioned on the cutting line CL may use any insulating layer that is disposed on the thin film transistor array and insulates and protects the signal lines and the electrodes.

In the flexible display according to the aspect, the inorganic layer such as the gate insulating layer GI and the passivation layer PAS is positioned on the cutting line CL, and the organic layer, which has a higher modification rate and a better impact resistance than the insulating material, is positioned on the inorganic layer. The organic layer is disposed on the inorganic layer, and thus can prevent a direct contact between a cutting means and the inorganic layer during the cutting process and can buffer an external force provided in the cutting process. Namely, the flexible display according to the aspect of the disclosure further includes the organic layer extended up to the cutting line CL, thereby preventing the external force from being directly applied to the inorganic layer by the cutting means in the cutting process. Further, the flexible display according to the aspect of the disclosure can prevent the fine crack from being generated in the inorganic layer by buffering and distributing the external force through the organic layer.

Furthermore, the flexible display according to the aspect of the disclosure can control a position of a neutral plane by disposing the organic layer on the inorganic layer, and thus prevent the crack resulting from the panel modification from being generated in the inorganic layer. As an example, at least one organic layer may be selectively disposed on the inorganic layer to control the neutral plane to be positioned on the inorganic layer. As another example, when the panel modification is performed, the crack generation is more susceptible to a tensile stress than a compressive stress. Therefore, the flexible display according to the aspect of the disclosure can be configured so that the compressive stress can be applied to the inorganic layer in the panel modification by selectively disposing at least one organic layer on the inorganic layer.

FIRST EXAMPLE

Figure 7:
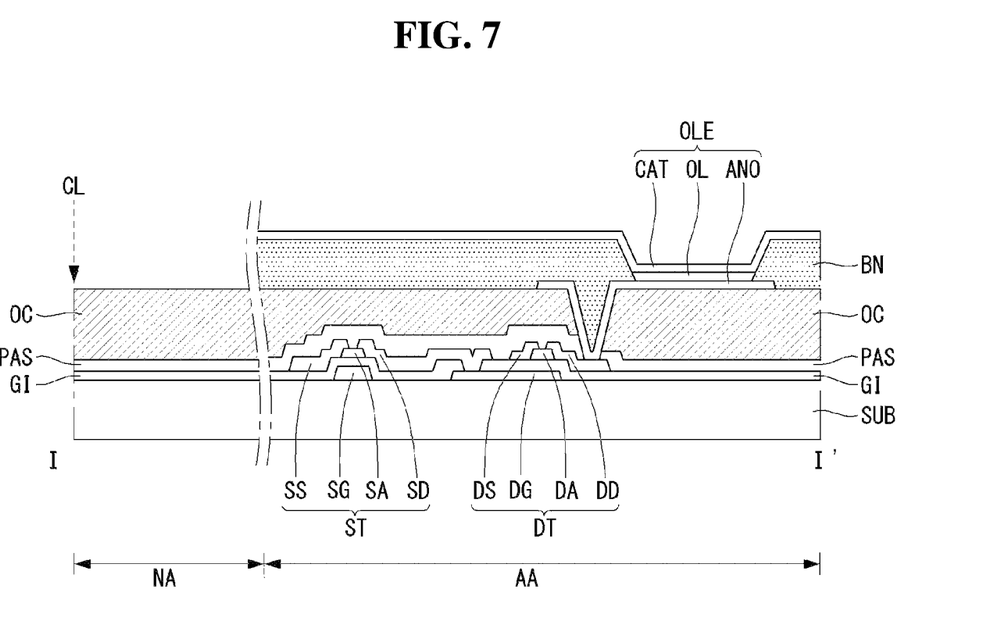
FIG. 7 is a cross-sectional view schematically illustrating a flexible display according to an aspect of the disclosure.

Referring to FIG. 7, a flexible display according to an aspect of the disclosure may include an overcoat layer OC formed on the entire surface of a mother substrate MS including a non-display area (shown in FIG. 1) correspondingly to an inorganic layer such as a gate insulating layer GI and a passivation layer PAS. Thus, when the mother substrate MS is separated into an individual display panel on a per cell basis, a flexible substrate SUB, the gate insulating layer GI, the passivation layer PAS, and the overcoat layer OC are cut together.

Display panels separated on a per cell basis each include a gate insulating layer GI, a passivation layer PAS, and an overcoat layer OC that are extended up to an end of a flexible substrate SUB so as to cover both a display area AA and a non-display area NA. Hence, the gate insulating layer GI, the passivation layer PAS, and the overcoat layer OC are exposed to the side of the flexible substrate SUB, and the overcoat layer OC as an organic layer is disposed as an uppermost layer at the end of the flexible substrate SUB.

The flexible display according to the aspect of the disclosure implemented as the above-described display panel can prevent a crack from being generated in the inorganic layers GI and PAS in a cutting process and ensure reliability and stability of the product.

SECOND EXAMPLE

Figure 8:
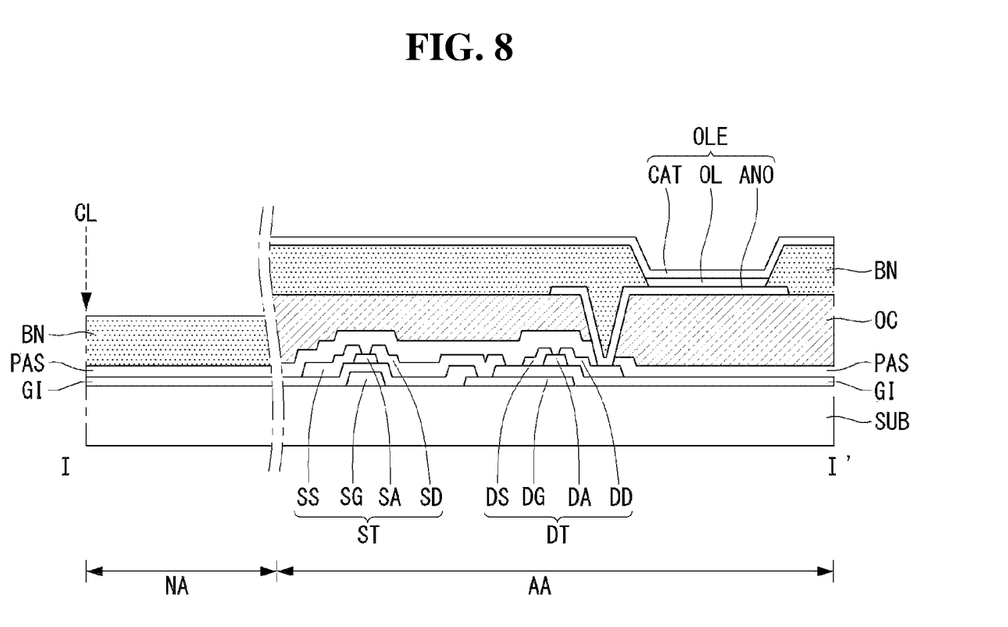
FIG. 8 is a cross-sectional view schematically illustrating a flexible display according to another aspect of the disclosure.

Referring to FIG. 8, a flexible display according to another aspect of the disclosure may include a bank layer BN widely formed on the entire surface of a mother substrate MS including a non-display area (shown in FIG. 1) correspondingly to an inorganic layer such as a gate insulating layer GI and a passivation layer PAS. Thus, when the mother substrate MS is separated into an individual display panel on a per cell basis, a flexible substrate SUB, the gate insulating layer GI, the passivation layer PAS, and the bank layer BN are cut together.

Display panels separated on a per cell basis each include a gate insulating layer GI, a passivation layer PAS, and a bank layer BN that are extended up to the end of a flexible substrate SUB so as to cover both a display area AA and a non-display area NA. Hence, the gate insulating layer GI, the passivation layer PAS, and the bank layer BN are exposed to the side of the flexible substrate SUB, and the bank layer BN as an organic layer is disposed as an uppermost layer at the end of the flexible substrate SUB.

The flexible display according to the aspect implemented as the above-described display panel can prevent a crack from being generated in the inorganic layers GI and PAS in a cutting process and ensure reliability and stability of the product.

THIRD EXAMPLE

Figure 9:
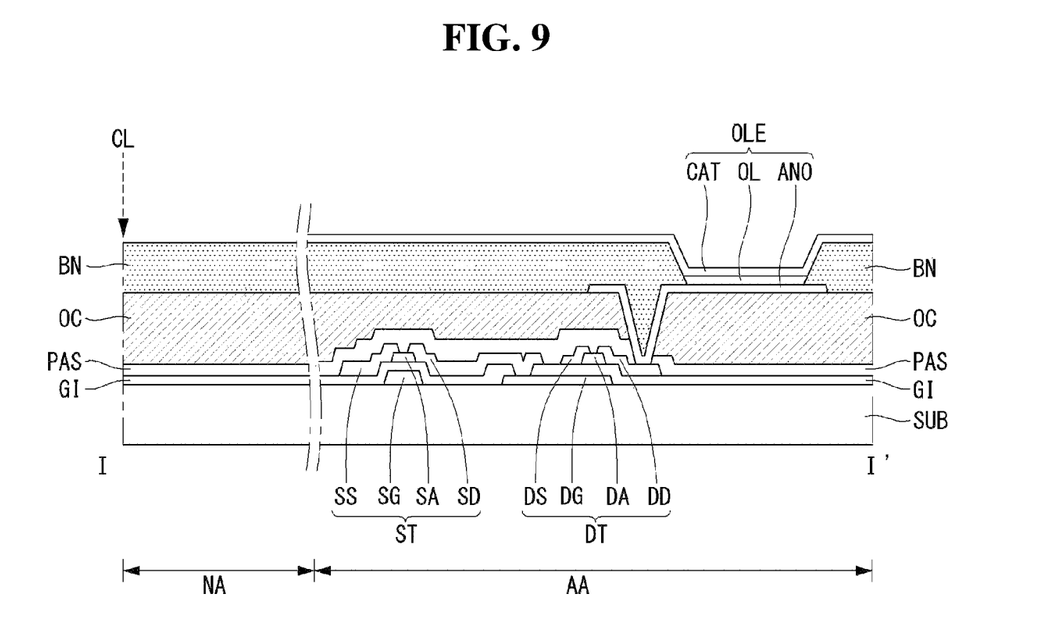
FIG. 9 is a cross-sectional view schematically illustrating a flexible display according to yet another aspect of the disclosure.

Referring to FIG. 9, a flexible display according to yet another aspect of the disclosure may include an overcoat layer OC and a bank layer BN formed on the entire surface of a mother substrate MS including a non-display area (shown in FIG. 1) correspondingly to an inorganic layer such as a gate insulating layer GI and a passivation layer PAS. Thus, when the mother substrate MS is separated into an individual display panel on a per cell basis, a flexible substrate SUB, the gate insulating layer GI, the passivation layer PAS, the overcoat layer OC, and the bank layer BN are cut together.

Display panels separated on a per cell basis each include a gate insulating layer GI, a passivation layer PAS, an overcoat layer OC, and a bank layer BN that are extended up to the end of a flexible substrate SUB so as to cover both a display area AA and a non-display area NA. Hence, the gate insulating layer GI, the passivation layer PAS, the overcoat layer OC, and the bank layer BN are exposed to the side of the flexible substrate SUB, and the overcoat layer OC and the bank layer BN as an organic layer are disposed as an uppermost layer at the end of the flexible substrate SUB.

The flexible display according to the aspect of the disclosure implemented as the above-described display panel can prevent a crack from being generated in the inorganic layers GI and PAS in a cutting process and ensure reliability and stability of the product.

FOURTH EXAMPLE

Figure 10:
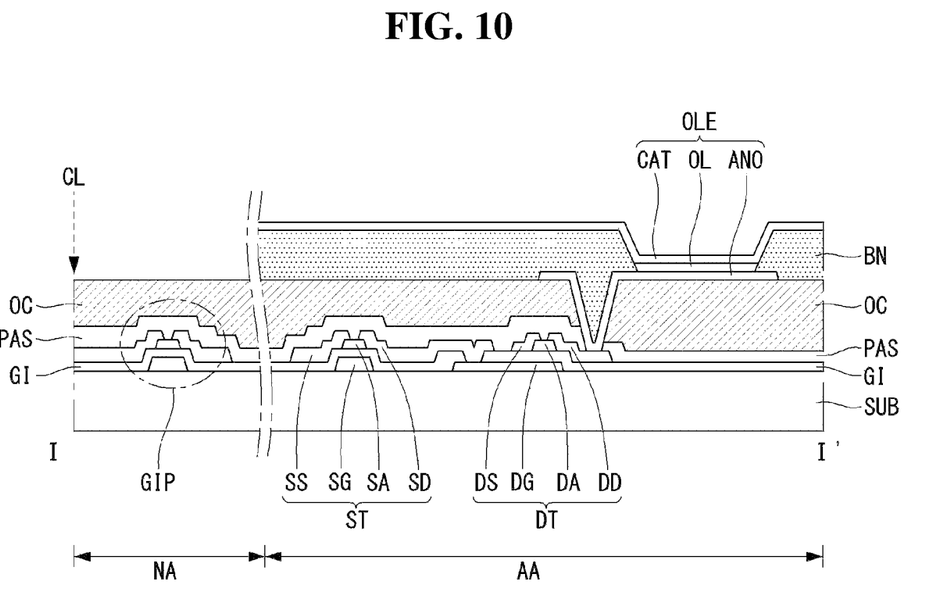
FIG. 10 is a cross-sectional view schematically illustrating a flexible display according to a further aspect of the disclosure.

Referring to FIG. 10, a flexible display according to a further aspect of the disclosure may include a gate driver circuit GIP implemented as a GIP type. In this instance, because the gate driver circuit GIP is positioned at a non-display area NA, the gate driver circuit GIP is positioned very close to a cutting line CL. Thus, the gate driver circuit GIP may be damaged by a crack propagated along an inorganic layer such as a gate insulating layer GI and a passivation layer PAS. The flexible display according to the aspect of the disclosure includes an organic layer that covers the gate driver circuit GIP and is extended up to the end of a flexible substrate SUB, thereby ensuring reliability and stability of the product.

Although aspects have been described with reference to a number of illustrative aspects thereof, it should be understood that numerous other modifications and aspects can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A flexible display comprising:
a flexible substrate;
a thin film transistor array positioned on the flexible substrate, and the thin film transistor array including a thin film transistor, an organic light emitting diode, inorganic layers, and organic layers; and
an encapsulation layer positioned on the thin film transistor array,
wherein at least one of the inorganic layers is extended to be exposed at an outermost end of the flexible substrate,
wherein the organic layers include a bank layer surrounding the organic light emitting diode,
wherein the bank layer is positioned on the at least one of the inorganic layers and is extended to be exposed at the outermost end of the flexible substrate,
wherein the encapsulation layer is positioned at a predetermined distance inwardly from the outermost end of the flexible substrate,
wherein the bank layer is positioned as an uppermost layer at the outermost end of the flexible substrate, and
wherein a total height of the organic layers and the inorganic layers located at the display area is greater than a total height of the organic layers and the inorganic layers positioned at the outermost end of the flexible substrate located at the non-display area.

2. The flexible display of claim 1, wherein the thin film transistor array includes:
a gate electrode;
a gate insulating layer covering the gate electrode;
a semiconductor layer positioned on the gate insulating layer and partially overlapping the gate electrode;
a source electrode and a drain electrode positioned on the semiconductor layer and respectively contacting both sides of the semiconductor layer;
a passivation layer covering the source electrode and the drain electrode;
an overcoat layer covering the passivation layer;
a first electrode positioned on the overcoat layer and contacting the drain electrode through a contact hole penetrating the passivation layer and the overcoat layer;
an organic emission layer positioned on the first electrode exposed by the bank layer; and
a second electrode positioned on the organic emission layer,
wherein the bank layer exposes a portion of the first electrode.

3. The flexible display of claim 2, wherein the at least one of the inorganic layers exposed at the outermost end of the flexible substrate is at least one of the gate insulating layer and the passivation layer.

4. The flexible display of claim 2, wherein the at least one of the organic layers exposed at the outermost end of the flexible substrate is the overcoat layer.

5. The flexible display of claim 2, wherein the at least one of the organic layers exposed at the outermost end of the flexible substrate is the bank layer.

6. The flexible display of claim 2, wherein the at least one of the organic layers exposed at the outermost end of the flexible substrate is a stack of the overcoat layer and the bank layer.

7. The flexible display of claim 1, further comprising a gate-driver-in panel (GIP) type gate driver circuit positioned on the flexible substrate,
wherein the at least one of the organic layers exposed at the outermost end of the flexible substrate covers the gate driver circuit.

8. A flexible display having a display area and a non-display area on a flexible substrate, comprising:
a thin film transistor, an organic light emitting diode, inorganic layers, and organic layers at the display area, and
an encapsulation layer on the organic layers and disposed inside from an outermost end of the flexible substrate,
wherein the inorganic layers are extended from the display area to the non-display area to be exposed at the outermost end of the flexible substrate, and at least one of the organic layers is extended from the display area to the non-display area,
wherein the organic layers include a bank layer surrounding the organic light emitting diode and extended to be exposed at the outermost end of the flexible substrate,
wherein the bank layer at the non-display area is located to be aligned with a cutting line during a cutting process of the flexible substrate, and
wherein the at least one of the organic layers is positioned as an uppermost layer at the cutting line, and
wherein a total height of the organic layers and the inorganic layers located at the display area is greater than a total height of the organic layers and the inorganic layers positioned at the outermost end of the flexible substrate located at the non-display area.

9. The flexible display of claim 8, wherein the inorganic layers include a gate insulating layer and a passivation layer.

10. The flexible display of claim 8, wherein at least one of the organic layers is an overcoat layer.

11. The flexible display of claim 8, wherein at least one of the organic layers is a stack of an overcoat layer and a bank layer.

12. The flexible display of claim 8, further comprising a GIP type gate driver circuit at the non-display area.

13. The flexible display of claim 12, wherein at least one of the organic layers covers the GIP type gate driver circuit.

* * * * *